In(As0.85P0.15)

Oct. 28, 1958 — OTTO-GERT FOLBERTH — 2,858,275

MIXED-CRYSTAL SEMICONDUCTOR DEVICES

Filed Dec. 20, 1955 — 3 Sheets-Sheet 2

$In(As_{0.8}P_{0.2})$ $In(As_{0.6}P_{0.4})$

United States Patent Office 2,858,275

Patented Oct. 28, 1958

2,858,275

MIXED-CRYSTAL SEMICONDUCTOR DEVICES

Otto-Gert Folberth, Erlangen, Germany, assignor to Siemens-Schuckertwerke Aktiengesellschaft, Berlin-Siemensstadt, Germany, a corporation of Germany Application December 20, 1955, Serial No. 554,361

Claims priority, application Germany December 23, 1954

8 Claims. (Cl. 252—62.3)

My invention relates generally to semiconductor devices. Such devices have a crystalline body of electrically semiconducting substance subjected to electric or magnetic fields, to corpuscular or wave radiation or to a plurality of such phenomena, for performing electrical, photo-electrical, optical or other physical effects. Examples of semiconductive devices, within the scope of my invention, are transistors, junction rectifiers, thermistors, detectors, photo-electric cells, thermo-electric junctions, photo-modulators, crystalline optical filters and other optical components, as photo-luminescent components.

In the past, semiconductor devices have predominantly been provided with a crystalline body of germanium (Ge) or silicon (Si) appertaining to the same subgroup in the fourth group of the periodic system as the semiconducting elements diamond (C) and gray tin (Sn).

It has also become known, and is disclosed in the copending application of H. Welker, Serial No. 275,785, filed March 10, 1952, now U. S. Patent No. 2,798,989 (assigned to the assignee of the present invention), that certain binary compounds of elements from the third group (B, Al, Ga, In) with elements from the fifth group (N, P, As, Sb) are also applicable as semiconductors. These sixteen compounds, hereinafter called "$A^{III}B^{V}$" or simply "III–V" semiconductors, can be looked upon as being approximate replicas of the semiconducting fourth-group elements C, Si, Ge, Sn with respect to width of the forbidden zone and lattice spacing.

When considering the physical properties, particularly those relating to semiconductance, of the individual fourth-group elements in their atom-number sequence: C, Si, Ge, Sn, it appears that relative to any one particular property, such as forbidden-zone width, lattice spacing or melting point, this property differs from element to element in the same sense of progression. Now, the semi-conductor III–V compounds add to the previously available discrete properties of the four elementary semiconductors a variety of intermediate property values thus affording a greater choice. It must be considered, however, that certain physical properties, such as width of the forbidden zone and carrier mobility, vary in mutually inverse relation from fourth-group element to element and also from III–V compound to compound. For instance, in the sequence from diamond (C) to gray tin (Sn), the width of the forbidden zone decreases, which is tantamount to decrease in melting point and decrease in temperature-stability of the electric properties, whereas, in the same sequence, the carrier mobility increases. The III–V semiconductors behave analogously. Hence, a III–V semiconductor of relatively great electron mobility also has a relatively great temperature dependence of its electric conductance properties. Thus, according to recent measurements, an optimum electron mobility of about 65,000 cm.$^2$/volt second is obtainable with indium antimonide (InSb) but is accompanied by a relatively great temperature dependence. For applications requiring least possible sensitivity to changes in temperature, it is preferable to use compounds of a wide forbidden zone, that is compounds corresponding in this respect to Ge or even to Si. Thus, with indium arsenide (InAs), having a forbidden-zone of 0.45 e. v. as compared with 0.27 e. v. of InSb, a much lesser temperature dependence than that of InSb is obtained, but the carrier mobility is considerably lower, namely approximately 30,000 cm.$^2$/volt second. If one selects a III–V compound still more closely related to Ge as to forbidden zone, then the temperature dependence is further reduced but the carrier mobility is also much lower. For instance, gallium antimonide (GaSb) has a forbidden zone of about 0.7 e. v. width corresponding substantially to that of Ge, but the electron mobility is only about 3,000 cm.$^2$/volt sec.

For many applications of semiconductors, therefore, it would be desirable to have available a semiconductor substance which combines high carrier mobility, such as a mobility similar to that of InAs, in conjunction with a relatively low temperature dependence. It is among the objects of my invention to provide such semiconductor substances.

Another object of my invention is to afford obtaining not only the discrete property values peculiar to the individual elemental and compound semiconductor substances heretofore available, but also any other property value within a wide and substantially continuous range, so that it becomes possible to "tailor" the crystalline semiconductor body, as regards its properties, to the optimum requirements of any particular application intended.

To achieve these results, and in accordance with a feature of my invention, I form the crystalline body of the semiconductor device by crystallizing it from a mixture of different III–V semiconductor compounds of solid solubility relative to each other and I compose the semiconducting mixed crystals so that the two component III–V compounds have an element of the third group in common. This mixed crystal is of the type $A_1^{III}(C_yD_{1-y})^V$ wherein A is an element of the third group, C and D are different respective elements of the fifth group, and the subscripts denote atom proportions, the value of $y$ being larger than zero and smaller than unity. Mixed crystals of this type form themselves readily from a melt of the components and can readily be processed and used in practice in much the same manner as the III–V compounds themselves.

It is known that two elements "U" and "V" which are isomorphous as well as soluble in each other in the solid state, may form mixed crystals within a continuous range of composition. This has been observed for such alloys as Ag—Au, Sb—Bi and Ge—Si. Within that range of composition, the respective properties of such mixed crystals show a continuous change, depending upon the particular proportions of the composition, from the properties of the pure element "U" to the properties of the pure element "V." This has also been observed, relative to forbidden zone and carrier mobility, with mixed crystals of the type $Ge_xSi_{(1-x)}$ formed by the semiconducting elements Ge and Si. However, the existence of mixed crystals of semiconducting III–V compounds of the type $A_1^{III}(C_yD_{1-y})^V$ was not known, and the utility and advantage of such compound mixed-crystals for use in electrical, photoelectrical, optical and the like semiconductor devices was likewise unknown.

I further discovered that the mixed crystals of the type $A_1^{III}(C_yD_{1-y})^V$ can be produced from a melt and can be processed substantially in the same manner as the elemental semiconductors or the individual III–V semiconductor compounds themselves. That is, the compound mixed crystals can be purified, homogenized by tempering, or can be processed toward monocrystalline structure, for instance by zone melting, melting and normal freezing (oriented solidification), or pulling a monocrystal out of the melt. For instance, a monocrystal can be produced in the known manner by placing a monocrystalline germ or seed in contact with the melt of the compound mixture and then pulling the seed away from the melt at the speed of crystallization so that a monocrystal of the desired mixed type will grow on the seed. I found that the melting, zone-melting or other heat treatment does not result in decomposition or segregation of the mixed crystal, and also that the mixed crystals can be doped with substitutional impurities (lattice-defect atoms), for instance as needed for producing p-n junctions. Doping the crystal with an element of the second periodic group, preferably cadmium or zinc (acceptors), produces p-type conductance. Elements of the sixth group, preferably sulphur, selenium or tellurium, act as donors, i. e. produce n-type conductance.

I have found that among the compound mixed crystal semiconductors according to the invention those of the groups $In_1(As_yP_{1-y})$ and $Ga_1(As_yP_{1-y})$ are particularly advantageous. Mixed crystals of such compositions can readily be produced by melting in each case the two component compounds together or by producing a melt from a mixture of three elements in the proper atomic proportion. The mixed crystals can further be readily subjected to any of the above-mentioned processing methods. In comparison with the semiconductor compounds InAs and GaAs as such, the width of the forbidden zone and hence the temperature dependence of the electric properties can considerably be modified by the selection of the amount of phosphorus. Consequently, for any particular application of the semiconductor device the most desirable intermediate values of the semiconductor properties can thus be obtained and the composition can be tailored as to its properties to definite predetermined values. This will be explained more in detail with reference to the drawings in which:

Figures 1, 2, 3, 4, 5, 6, 8:
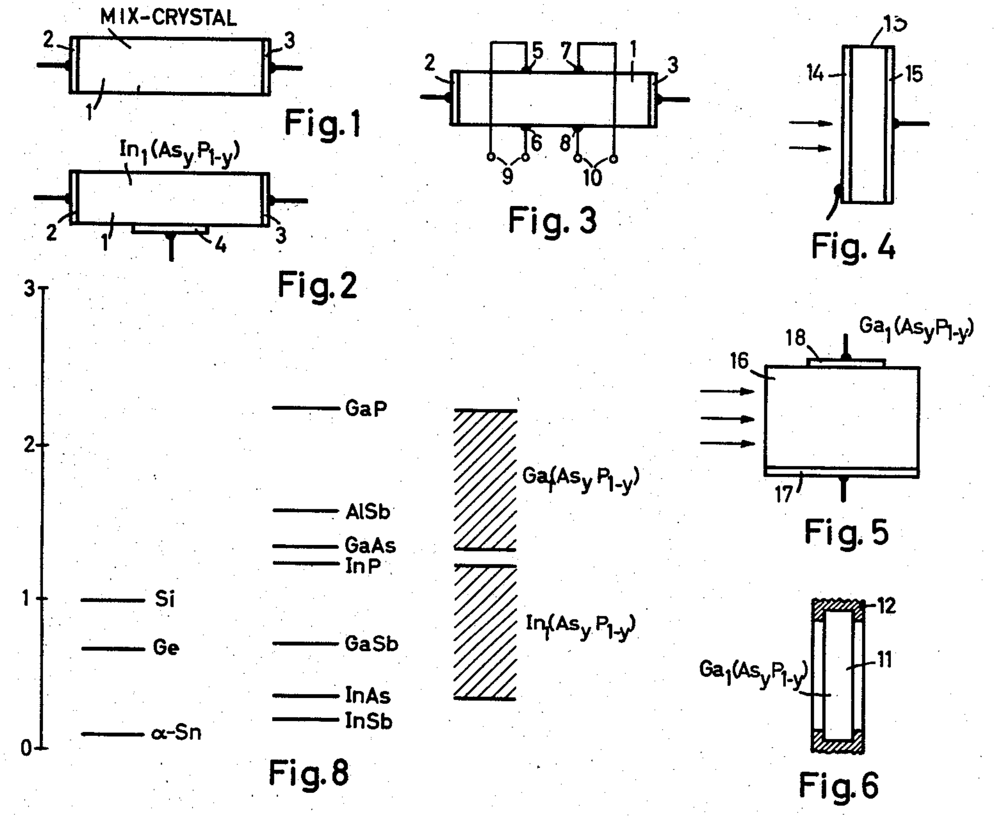
Figs. 1 to 6 show schematically different semiconductor devices according to the invention, each comprising as its essential component a III–V compound mixed crystal.

The semiconductor device illustrated in Fig. 1 represents an example of the simplest form and, depending upon the choice of the component materials, is applicable for various purposes. The device is composed of a crystal-line body 1, preferably a monocrystal, and two terminals or electrodes 2 and 3 of metal to which respective circuit leads are connected. According to the invention the crystal 1 may be formed of an arsenide and a phosphide of indium or gallium and consists of a mix-crystal as explained in the foregoing. The size of the device depends upon the intended application and also upon the available technological manufacturing equipment. For instance, the length may be about 30 mm., the width about 5 mm. and the thickness between 0.5 and 5 mm. It will be understood that for power current applications a number of such devices can be operated in series or in parallel to suit the particular requirements.

When the two electrodes 2 anod 3 are made of a barrier-free metal, the device is suitable as a thermistor. In this case the electrodes 2 and 3 may be formed of a coating of gold or of a gold alloy, or they may consist of a metal which acts as a substitutional impurity relative to the particular mixed crystal 1 and has the same type of conductance as the crystal. For instance, when the crystal is p-conductive, then the barrier-free electrodes 2 and 3 may consist of cadmium or zinc or of a metal composition containing cadmium or zinc.

A device according to Fig. 1 with barrier-free electrodes is also applicable as a magnetically controllable resistor. That is, the effective resistance of the mixed crystal 1 depends upon the intensity of any magnetic field which has a component perpendicular to the flow of current between the electrodes 2 and 3. By varying the strength of the magnetic field, the resistance of the device can be varied.

A device of the same type is further applicable for utilization of the magnetic barrier effect in accordance with the principles disclosed in the copending application of H. Welker, Serial No. 297,788, filed July 8, 1952, now Patent 2,736,858, and known from the articles published by Weisshaar and Welker in Zeitschrift für Naturforschung, vol. 8a, No. 11, 1953, page 681; and by Madelung, Tewordt and Welker in the same German periodical, vol. 10a, No. 5, 1955, page 476. To this end, a portion or all of the surface of the mixed crystal 1 is to be surface treated, for instance, by electrolytic etching, so that the surface recombination is insufficient to replenish the electron-hole pairs displaced by the effect of a magentic field applied in the manner mentioned in the foregoing. In this case, it is further necessary to make the mixed crystal 1 of material purified to substantially intrinsic conductance so that the lattice defect atoms in the crystal are sufficiently scarce to make the electron concentration and the hole concentration of the same order of magnitude. When the entire surface of the mixed crystal 1 is thus treated for low surface recombination the barrier effect is symmetrical and the device is suitable as a switching or triggering member. When only one side of the crystal is thus surface-treated and the opposite side has a higher surface recombination so that all magnetically displaced electron-hole pairs are replenished by surface recombination, the device is suitable for operation as a magnetic-barrier rectifier as is more fully described in the mentioned copending application and publications.

Fig. 2 illustrates the invention embodied in a junction transistor. The mixed crystal 1, consisting for instance of indium arsenide and indium phosphide, is contacted by two directing or control electrodes 2 and 3 of which one acts as the emitter and the other as the collector. The mixed crystal is further contacted by a barrier-free base electrode 4. One of the directing electrodes 2, 3 may consist of, or contain, cadmium, and the other may consist of, or contain, selenium or tellurium or sulphur. By fusing the two electrode coatings 2, 3 onto the crystalline body, lattice-defect atoms are diffused into the adjacent zones of the body to produce a p-n junction. If the semiconductor mixed crystal 1 is substantially of intrinsic conductance, the described transistor forms a p-i-n junction.

Fig. 3 illustrates the application of the invention to a Hall generator. The device is similar to that of Fig. 1 as far as components 1, 2 and 3 are concerned, but the mixed crystal 1 is further provided on opposite sides with barrier-free point electrodes 5 and 6 which are connected to a pair of terminals 9. The Hall electrodes 5 and 6 are located on equi-potential points when the device is not subjected to a magnetic field, and the voltage across terminals 9 is then zero. When the mixed crystal 1 is subjected to a magnetic field which has a component perpendicular to the current flow direction between terminal electrodes 2 and 3, a voltage difference occurs between Hall electrodes 5 and 6 and this difference, the so-called Hall voltage, appears across terminals 9 and is a measure of the magnetic field. Such devices are suitable, for instance, as multiplying or torque measuring devices, as the Hall voltage is proportional to the product of magnetic field strength times intensity of the electric current flowing through the semiconductor. As a rule, such a Hall generator need be equipped with only one pair of Hall electrodes. In Fig. 3 an additional pair of Hall electrodes 7, 8 is shown connected to a second pair of terminals 10. The two Hall voltages may be used additively in accordance with the invention disclosed and claimed in the copending application of H. Weiss, Serial No. 491,976, filed March 3, 1955 (assigned to the assignee of the present invention). Another use for such a double-voltage Hall generator is for such measuring purposes as described below.

Fig. 4 illustrates schematically a photo-electric cell according to the invention. The semiconductor body 13 consists of a III–V compound mixed-crystal and is contacted on two opposite planar sides by barrier-free electrodes 14 and 15. Aside from its different shape, the photo-cell is similar to the device described with reference to Fig. 1 except that the electrode 14 consists of a thin transparent metal foil. As will be explained below, such a photo-cell, particularly if equipped with a mixed crystal of arsenide and phosphide of gallium, is suitable in the infrared range in addition to the range of visible light. The direction of the incipient wave radiation is indicated by arrows.

Fig. 5 represents the application of the known photomodulator principle to a device according to the invention. The crystalline body 16 of the device may consist of a mixed crystal of GaAs—GaP. It is contacted by a barrier-free base electrode 17 and an injector electrode 18 which may be a point electrode or a junction electrode. The direction of the incident wave energy is indicated by arrows. The radiation, for instance infrared light, passes through the entire crystal body 16 which operates as a filter of controllable density. The optical density depends upon the voltage applied between base electrode 17 and injector electrode 18 so that the beam of radiation leaving the modulator device can be modulated as regards its intensity.

Fig. 6 shows an optical filter 11 in a holder 12. The filter may consist of $Ga_1(As_yP_{1-y})$ and can be given any desired density within the available range of visible and infrared light.

Before dealing with specific properties of devices according to the invention as exemplified by the foregoing embodiments, examples of methods suitable for producing and processing the compound mixed-crystal bodies for such devices will first be described. Chosen as a first example is the production of mixed-crystal compositions of the type $In(As_yP_{1-y})$, and reference will be had to the data in the first, second and fourth vertical columns of the tabulation presented below.

*Properties of mix-crystals* $In(As_yP_{1-y})$

| $y$ | Quantity (g.) | ΔE (e. v.) | $\mu_n$ (cm.²/V sec.) | $T_L$ (° C.) | Lattice const. (A.) |
|---|---|---|---|---|---|
| 0 (InP) | 15.000 In<br>4.799 P | 1.35 | 3,500 | 1,070 | 5.86 |
| 0.2 | 15.000 In<br>2.734 As<br>3.803 P | 1.175 | 4,000 | 1,045 | 5.89 |
| 0.4 | 15.000 In<br>4.267 As<br>2.780 P | 1.00 | 4,500 | 1,020 | 5.93 |
| 0.6 | 15.000 In<br>6.055 As<br>1.800 P | 0.815 | 7,000 | 990 | 5.97 |
| 0.8 | 15.000 In<br>7.883 As<br>0.860 P | 0.625 | 12,000 | 965 | 6.0 |
| 1.0 (InAs) | 15.000 In<br>9.801 As | 0.45 | 20,000 | $T_S$=936 | 6.04 |

More specifically the composition $In(As_{0.8}P_{0.2})$, corresponding to the value $y$—0.8, will be specifically mentioned, although the method is analogously applicable for the production of other III–V semiconductor mix-crystals.

Figure 7:
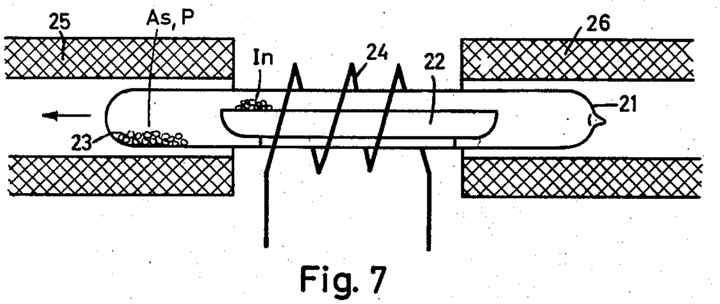
Fig. 7 is a schematic diagram illustrating a method of making mixed crystals for devices according to the invention.

According to one method, the mix-crystal is produced from a melt of its elemental constituents In, As and P as follows. The proper quantities, according to column 2 of the table, are placed into a quartz ampule 21 (Fig. 7) of about 60 cm.³ volume (27 cm. length, 2 cm. exterior diameter, 1.7 cm. interior diameter). The amount of 15.000 grams In is placed into a carbonized quartz boat 22. The amounts of As (7.883 grams) and P (0.860 gram) are placed upon any other spot 23 on the bottom of the ampule outside the boat. The ampule is then sealed off, preferably after filling it with $N_2$ at 200 Torr.

The melting is carried out by a two-temperature method as described and claimed in the copending application of O. G. Folberth and R. Gremmelmaier, Serial No. 534,852, filed September 16, 1955 (assigned to the assignee of the present invention), and as known from an article by Folberth and Weiss published in the German periodical "Zeitschrift für Naturforschung," vol. 10a, No. 8, 1955, page 615.

According to the two-temperature method, the portion of the ampule containing the boat wherein the melting process proper is to take place, is heated to a temperature somewhat above the liquidus point $T_L$ (column 5 of the table) of the mix-crystal desired; and the remaining portions of the ampule are heated to a lower temperature $T_K$ which, however, is at least as high as the condensing temperature of the high-volatile components As and P at the particular partial vapor pressure of these components in the ampule.

Accordingly, in the production of the mix-crystal $In(As_{0.8}P_{0.2})$, the boat 22 (Fig. 7) is heated to about 960° C. by high-frequency heating with the aid of a current-traversed inductance coil 24. The other portions of the ampule are heated to a temperature $T_K$ of about 700° C. by means of heating coils 25 and 26 which are shoved over the ends of the ampule.

When the steady-state temperatures $T_L$ and $T_K$ are attained, the amounts of As and P are fully evaporated. Then, the proportions of As and P which are to form constituents of the mix-crystal, are absorbed from the vaporous phase into the melt within the boat; and the residual amounts of the relatively high volatile elements As and P now form the vaporous phase. The weighed-in quantities apparent from column 2 of the table are such that the vapor phase, in the state of equilibrium, has the vapor pressure required for a "stoichiometric" In—As—P melt according to the desired formula $In(As_yP_{1-y})$ at the liquidus point $T_2$.

The melt thus produced may be permitted to slowly solidify by normal freezing, i. e. by permitting the melt to commence solidifying at one end of the boat. Then, however, the solidfied crystal contains at the first-frozen end more phosphorous, for instance, according to a composition of about $In_1(As_{0.7}P_{0.3})$, whereas the last-solidified end contains more arsenic according to the approximate composition $In(As_{0.9}P_{0.1})$. Such crystals are desirable or satisfactory for some applications. Generally, howere, a more homogeneous crystal is preferable and can be obtained as follows.

The melt produced as described above, is at first permitted to solidify rapidly and in an unoriented manner, the velocity of solidification being such that an inhomogeneous fine-structure will result which, however, is quasi-homogeneous as far as the crystal as a whole is concerned. A microscopically or molecularly homogeneous mixture is then obtained by subsequently zone-melting the solidified crystal, preferably in two successive and opposingly directed steps. As is well known, during zone-melting, a narrow zone of the crystal is heated to the melting point, and this zone is progressively advanced along the crystal (see W. A. Pfann, Journal Metals, July 1952, page 747). In this manner a homogeneous mixed crystal, having in the present specific example the composition $In(As_{0.8}P_{0.2})$, is obtained with the exception of a very small residual quantity which approximately corresponds to the width of the melting zone at the last-solidifying end. This end is cut off, and the homogenized crystal may be cut into sections by means of a diamond saw, each section forming a semiconductor body for use in an electrical or optical device as described.

Another method of producing mixed crystals for the purposes of the present invention is to first produce and purify the individual semiconductor compounds. Thus, InAs and InP can be individually produced by melting the constituents together and can then be purified by zone-melting. However, I prefer using the melting method described in the above-mentioned copending application Serial No. 534,852. According to that method the low volatile component (In) of each individual compound is placed into a crucible or boat as shown at 21 in Fig. 7 on the drawing of the present application, and the high volatile component (As or P) is placed into the same ampule but outside the boat. Then the method is carried out substantially as described in the foregoing with reference to the direct production of mixed crystals from the three constituent elements. After producing the individual compounds and purifying them by zone-melting, they are mixed in the proper proportion and are then melted together. This can likewise be done by a method and means as described above with reference to Fig. 7 of the drawing.

In conjunction with any of the methods above described, corresponding quantities of substitutional impurities may be left in, or added to, the crystal to obtain any desired degree of doping of the mix-crystals. This will be more fully explained below.

It is apparent from the table that the properties of the mix-crystals $In(As_yP_{1-y})$ are intermediate those of the two constituent compounds InAs ($y=1$) and InP ($y=0$) which, for comparison, are also referred to in the table. Thus it is possible to produce semiconductor crystals of any desired forbidden zone between those of InAs (0.45 e. v.) and InP (1.35 e. v.). Fig. 8 is a graph showing values of the forbidden zone $\Delta E$ in electron volts for III–V mixed crystals of the types $In(As_yP_{1-y})$ and $Ga(As_yP_{1-y})$ in comparison with the discrete values $\Delta E$ of seven III–V semiconductors: InSb, InP, GaAs, AlSb, GaP, and also in comparison with the $\Delta E$ values of the tetravalent semiconductor elements α-Sn, Ge, Si. It will be recognized that the III-V mix-crystal compounds extend over a comparatively very large range of those $\Delta E$ values that are of foremost interest for the various technical uses and varities of semiconductor devices.

Figure 9:
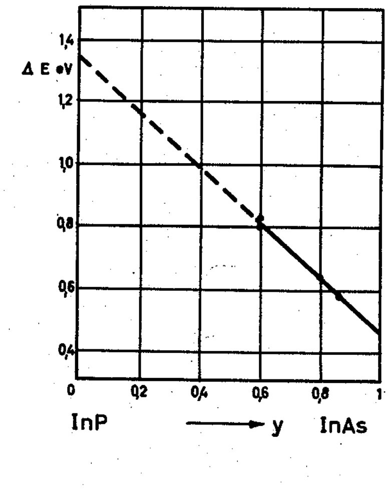
Figure 10:
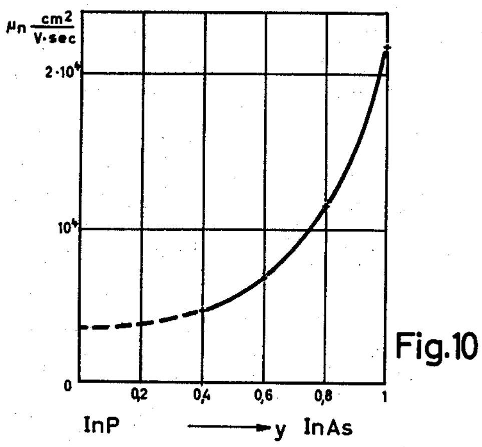

Fig. 9 is a coordinate diagram representing the dependence of the forbidden zone $\Delta E$ (e. v.) upon the particular composition of the mix-crystal $In(As_yP_{1-y})$, the abscissa denoting values of $y$. The diagram reflects the continuity of change between the respective values of the marginal compound InAs ($y=1$) and InP ($y=0$). Analogously, the other semiconductor parameters are steady functions of the composition. For instance, the electron mobility $\mu_n$ (cm.$^2$/V sec.), represented in Fig. 10, decreases monotonously with increasing values of $y$ from the mobility value of pure InAs (about 20,000 cm.$^2$/V sec.) down to the value of pure InP (about 3,500 cm.$^2$/V sec.).

The semiconductor properties of these mixed crystals are clearly in evidence also when applying other physical measuring and testing methods. The mixed crystals are brittle, have a relatively smooth and shiny break surface, are stable in dry and moist air, and are reduced by chemical agents only with difficulty. Infrared measurements indicated good optical transparency for electromagnetic radiation of wave lengths above the optical absorption edge. The diffraction index, amounting to approximately $n=3$ to 3.5, is very great.

Figure 11:
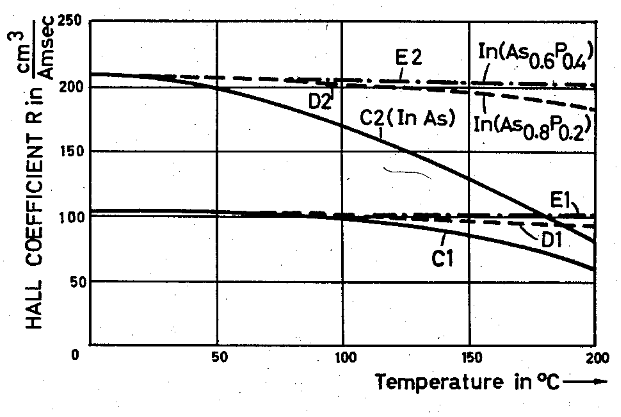
Figs. 8 to 11 are explanatory diagrams relating to various properties of $In(As_yP_{1-y})$ and $Ga(As_yP_{1-y})$ mixed-crystal semiconductors.

Since the width of the forbidden zone $\Delta E$ essentially determines the temperature dependence of the semiconductor properties, it is often imperative to employ a particular substance whose forbidden zone $\Delta E$ is best adapted to the particular problem involved. For instance, the use of InAs as a Hall generator is limited by the fact that, for instance in a Hall crystal having the Hall coefficient R=100 cm.$^3$/amp. sec., this value declines by about 4% when the crystal temperature is raised to 100° C. With a still greater Hall coefficient, this temperature dependency of InAs is further pronounced. If it is desired to obtain a lower temperature sensitivity in conjunction with a Hall coefficient of a similarly large magnitude, then it is necessary to employ a substance of a wider forbidden zone $\Delta E$. In such cases the $In(As_yP_{1-y})$ mixed crystals are of advantage. The diagram of Fig. 11 represents the dependence of the Hall coefficient R upon the centigrade temperature for different mixed crystals in comparison with the corresponding values of InAs. Curves C1 and C2 relate to InAs. Curves D1 and D2 relate to mixed crystals $In(As_{0.8}P_{0.2})$. Curves E1 and E2 relate to mixed crystals $In(As_{0.6}P_{0.4})$. For facilitating comparison, two specimens of each composition were tested, namely, a specimen (C1, D1, E1) having a Hall coefficient of approximately 100, and another specimen (C2, D2, E2) having a Hall coefficient of 200 cm.$^3$/amp. sec. at room temperature (20° C.). The diagram shows that the temperature dependency of the mixed crystal is considerably more favorable than that of InAs. On the other hand, the electron mobility $\mu_n$ of the mix-crystals is lower than that of pure InAs as is apparent from the fourth vertical column of the above-presented table. Consequently, the mix-crystals offer the possibility to arrive at a comprise for any particular problem by selecting a mix-crystal semiconductor body whose temperature dependence is just satisfactory in conjunction with a highest possible electron mobility $\mu_n$, this mobility being essential for optimum efficiency of a Hall generator.

Similar conditions obtain relative to the use of semiconductor substances for rectifiers and transistors. The rectifier and transistor substance heretofore most commonly used is germanium having a forbidden zone of approximately 0.72 e. v. This value determines the temperature sensitivity of the characteristic rectifier and transistor parameters made of germanium. In many respects, these characteristic parameters could be made more favorable if a substance having properties similar to those of Ge but a wider forbidden zone $\Delta E$ were available. Such substances are indeed present within the system $In(As_yP_{1-y})$. For instance, a mix-crystal of the composition $In(As_{0.4}P_{0.6})$ has a forbidden zone of approximately 1 e. v. in conjunction with an electron mobility even larger than that of germanium.

For wave-energy detectors in the cm.- and mm.- ranges, it is of decisive importance to possess substances of high electron mobility $\mu_n$ in conjunction with a width of the forbidden zone at least corresponding to that of Ge. In these case also mix-crystals of the type $In(As_yP_{1-y})$ are favorably applicable. For instance, the crystal $$In(As_{0.6}P_{0.4})$$

has an electron mobility of approximately 7,000 cm.$^2$/V sec. in conjunction with a forbidden zone corresponding approximately to that of Ge.

Of particular importance is the use of the mentioned mixed crystals for the production of electro-optical and optical devices such as filters. By virtue of the mixed crystals $In(As_yP_{1-y})$ it has become possible to produce infrared filters which are transparent to radiation of a wave length longer than a certain limit value $\lambda_K$, but which are opaque relative to all other wave lengths. In all ranges of wave length which heretofore could not be covered by mix-crystal semiconductors, only a few discrete values of $\lambda_K$ were available. The present invention, however, makes it possible to produce filters with any desired and predetermined value $\lambda_K$ located within the range of wave lengths for which the particular family of mix-crystal compounds is applicable. For instance, the mix-crystals $In(As_yP_{1-y})$ have a $\lambda_K$-range approximately from 1 to 3.8 microns.

The conditions relating to the quasi-binary system GaAs—GaP are generally analogous to those described above with reference to the system InAs—InP. The system $Ga(As_yP_{1-y})$ also exhibits a gapless mix-crystal formation over the entire range of possible compositions. The semiconductor parameters vary continuously from one to the other limit composition. The techniques concerning the preparation and processing of the mixed crystals are substantially the same as described for the mixed crystals $In(As_yP_{1-y})$, however the liquidus temperatures are higher in accordance with the likewise higher melting points of the limit compounds GaAs and GaP. The liquidus temperatures in this case extend through the range of about 1240 to about 1350° C. The forbidden zone $\Delta E$ varies continuously in dependence upon the concentration, but not linearly as in the case of $In(As_yP_{1-y})$. That is, the curve of the forbidden zone versus composition has two approximately linear portions merging with each other to form a noticeable knee.

Mixed crystal semiconductors of the type $Ga(As_yP_{1-y})$ are applicable generally in a similar manner as described with reference to the $In(As_yP_{1-y})$ crystals. However, the application of $Ga(As_yP_{1-y})$ mixed crystals for photocells and similar wave-energy responsive devices deserves special mentioning. By varying the composition, it is possible to adapt the absorption spectrum of the photocell to the emission spectrum of the radiator. This is important, for instance, for the manufacture of the socalled "solar converters."

It has been mentioned above that mixed-crystal semiconductors according to the invention can be modified to a large extent by the addition of foreign atoms, preferably by Zn or Cd for the production of p-type conductance and by S, Se or Te for the production for n-type conductance. Some of the effects thus obtainable are evidenced by the test results compiled in the diagrams shown in Figs. 12 to 16 with reference to conductance and Hall coefficient of various specimens.

The measurements were made at temperatures between 20 and 500° C. with the aid of method and apparatus known from a publication by Madelung and Weiss in the German periodical "Zeitschrift für Naturforschung," volume 9a, No. 6, 1954, page 527. The specimens tested were polycrystalline and had a cross section of 5 by 5 mm.² and a length of about 30 mm. The Hall voltage was measured with two pairs of Hall electrodes contacting the crystal body in a mutual distance of 10 mm. in accordance with the Hall generator described above with reference to Fig. 3. This permitted testing the homogeneousness of the specimens even at the higher temperatures. The conductance in all specimens was found to be in accordance with Ohm's law. The crystals were heated only to such an extent that irreversible changes did not yet occur. The Hall voltages were measured with magnetic fields of 3000 and 6000 Gauss.

Figure 12:
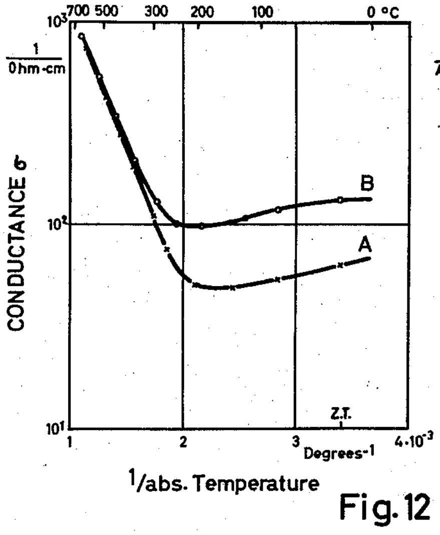
Figs. 12 to 17 are coordinate diagrams relating to specific conductance and Hall coefficient of III–V mixed-crystal composition and to the effect of added lattice defect atoms.
Figure 13:
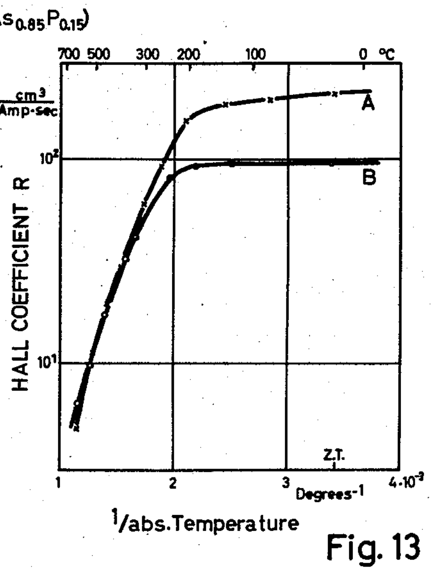
Figure 14:
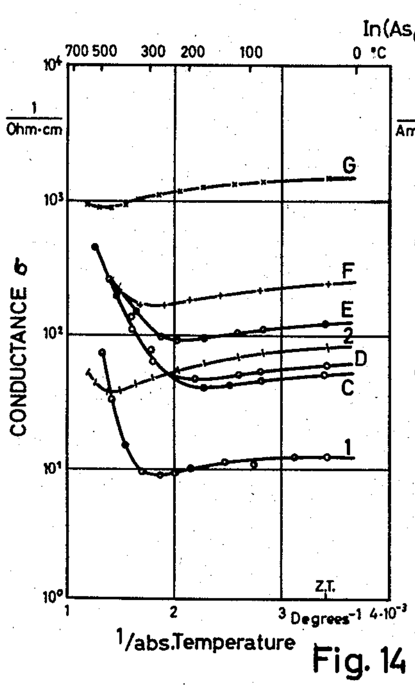
Figure 15:
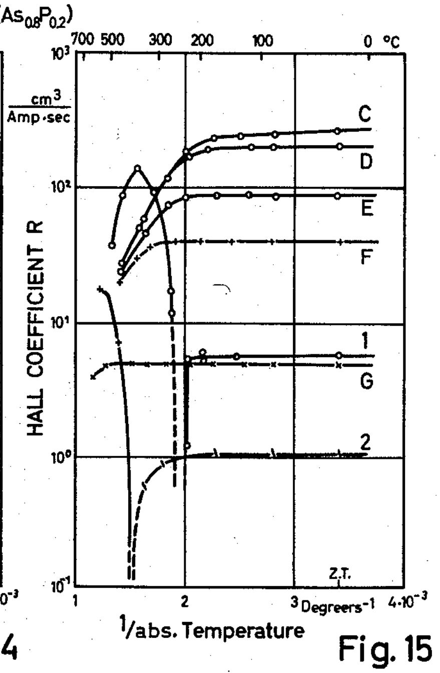

Figs. 12 and 13 represent the specific conductance and the Hall coefficient respectively of two n-conductive specimens A and B of the composition $In(As_{0.85}P_{0.15})$ versus the inverse value 1/T of the absolute temperature in degrees$^{-1}$ Kelvin. The corresponding curves for mixed crystals of the composition $In(As_{0.8}P_{0.2})$ are shown in Figs. 14 and 15. Specimens C to G were n-conducting. Specimens 1 and 2 were p-conducting. Specimens C and E were prepared from pure As and Pure P. Specimens E, F and G, in this sequence, contained an increasing amount of sulfur. The p-conducting specimens were obtained from specimen D by doping with zinc. Specimen 1 was provided with $10^{18}$, specimen 2 with $2\times10^{19}$ zinc atoms per cm.³.

It can be recognized from Figs. 14 and 15 that in $In(As_{0.8}P_{0.2})$ the ratio of electron mobility to hole mobility is very great. This is apparent from the fact that in the conductance diagram (Fig. 14) the curve of the p-conductive specimen 2 crosses the curves of the n-conductive specimens C, D and bends into the intrinsic-conductance portion of the curve only at a considerably higher temperature than for the specimens C and D. The inclination of curve 1 at high temperatures is larger than that of curves C and D. A given measured value for curves 1 and 2 occurs at higher temperatures than for curves C and D. A similar behavior is exhibited by the p-conductive specimens of InSb and InAs and is indicative of a very large mobility ratio. The maximum of the Hall coefficient, occurring before the curve turns into the intrinsic-conductance portion of p-conducting specimens 1 and 2 (Fig. 15) is very high above the extrinsic-conductance portion.

Figure 16:
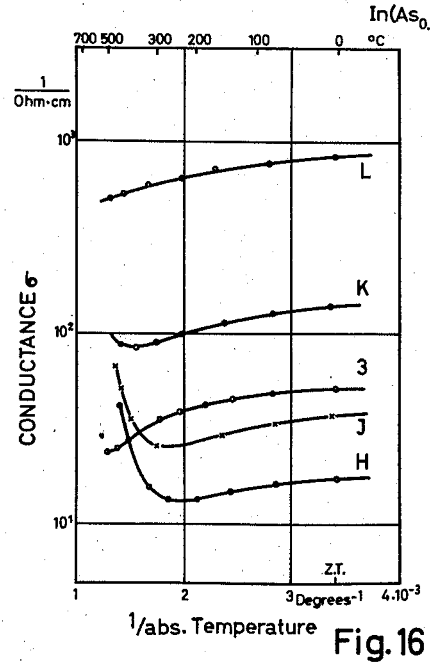

Figs. 16 and 15 represent the specific conductance and Hall coefficient of four n-type and one p-type specimen of the composition $In(As_{0.6}P_{0.4})$ as a function of 1/T. The two n-specimens H and J were made from pure arsenic and pure phosphorus. Specimens K and L were provided with sulfur as substitutional impurity to a lesser and larger degree respectively. The p-conductive specimen 3 was obtained by doping the specimen J with $10^{19}$ zinc atoms per cm.³. The conductance curve of specimen 3 crosses the curves of the n-type specimens H and J which at this point already approach intrinsic conductance. Since a tempering of specimen 3 was to be expected at temperatures above 600° C., the measurements were not continued up to intrinsic conductance with the latter specimen.

Figure 17:
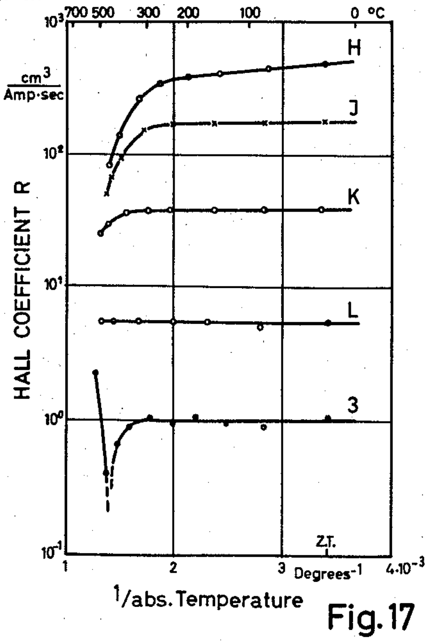

If the three diagrams Figs. 12, 14, 16 are compared with each other and if a comparison is made between the Hall-coefficient diagrams Figs. 13, 15 and 17, it is clearly apparent that intrinsic conductance of specimens having the same lattice-defect content occurs at higher temperatures if the proportion of phosphorus in the composition is higher. The temperature dependance of conductance and Hall coefficient in the intrinsic range increases to the same degree with an increased phosphorus content. This is indicative of the fact that the width of the forbidden zone increases with an increasing amount of phosphorus in the mixed crystal, as is also apparent from Fig. 9.

It will be obvious to those skilled in the art, upon a study of this disclosure, that my invention is applicable for a variety of devices and purposes and that it can be embodied in a large variety of III–V mix-crystal compounds other than those specifically described, without departing from the essential features of my invention and within the scope of the claims annexed hereto.

I claim:

1. A semiconductor device, comprising a solid body formed of a mixed crystal of binary semiconductor compounds, said crystal being of the type $A_1^{III}(C_yD_{1-y})^V$, wherein $A^{III}$ is an element selected from the group consisting of boron, aluminum, gallium and indium, $C^V$ and $D^V$ are different respective elements selected from the group consisting of nitrogen, phosphorus, arsenic and antimony, and the subscripts denote atom proportions, the value $y$ being larger than zero and smaller than unity by an amount sufficient for the values of carrier mobility and melting temperature of the mixed crystal to be different from, and intermediate of, those of the binary compounds of $A^{III}C^V$ and $A^{III}D^V$.

2. A semiconductor device, comprising a solid body consisting of a mixed crystal of indium arsenide and indium phosphide and having the composition $$In_1(As_yP_{1-y})$$

wherein the subscripts denote atom proportions, the value of $y$ being larger than zero and smaller than unity, said mixed crystal having a melting temperature intermediate those of InAs and InP.

3. A semiconductor device, comprising a solid body consisting of a mixed crystal of gallium arsenide and gallium phosphide and having the composition $$Ga_1(As_yP_{1-y})$$

wherein the subscripts denote atom proportions, the value of $y$ being larger than zero and smaller than unity, said mixed crystal having a melting temperature considerably different from, and intermediate of, those of GaAs and GaP.

4. An electric semiconductor device, comprising a solid resistance body and electrode means in contact with said body, said body consisting of a mixed crystal having extrinsic conductance and formed substantially of arsenic, phosphorus and substance selected from the group consisting of indium and gallium in atomic proportions according to the composition $A_1^{III}(As_yP_{1-y})$ wherein $A^{III}$ is said substance and y is a value appreciably larger than zero but smaller than unity, said mixed crystal having a melting point different from, and intermediate of, those of the binary compounds $A^{III}As$ and $A^{III}P$.

5. The method of producing a semiconductor device, which comprises preparing a melt composed of two binary III–V semiconductor compounds soluble in each other in the solid state and having an element of the third periodic group in common, the respective quantities of said two compounds being sufficient for subsequently producing a mixed crystal having a melting point different from, and intermediate of, those of said respective compounds, crystallizing a solid body from the melt by normal freezing, and thereafter zone-melting the body to obtain a homogeneous mixed-crystal semiconductor.

6. The method of preparing a semiconductor device, which comprises preparing a substantially pure arsenide of an element selected from the group consisting of indium and gallium, preparing a substantially pure phosphide of said element, preparing a melt from a mixture of said arsenide and phosphide in respective quantities sufficient for forming a solid solution having a melting point different from, and intermediate of, indium arsenide and gallium arsenide, and crystallizing a solid body from the melt.

7. The method of producing a semiconductor device, which comprises preparing a melt from arsenic (As), phosphorus (P) and gallium (Ga) in an atomic proportion $Ga_1(As_yP_{1-y})$, wherein the value $y$ is larger than zero and smaller than unity by an amount sufficient for producing from the entire melt a solid solution having a melting point different from, and intermediate of, those of gallium arsenide and gallium phosphide, and crystallizing a solid body from the melt.

8. The method of producing a semiconductor device, which comprises preparing a melt from arsenic (As), phosphorus (P) and indium in an atomic proportion $In_1(As_yP_{1-y})$, wherein the value $y$ is larger than zero and smaller than unity, the respective quantities of As and P being sufficient for producing a solid solution having a melting point different from, and intermediate those of InAs and InP, and crystallizing a solid body from the melt.

References Cited in the file of this patent

UNITED STATES PATENTS 2,710,253 Willardson .............. June 7, 1955

OTHER REFERENCES

W. A. Pfann: Journal Metals, July 1952, p. 747.